US009875785B2

(12) United States Patent
Jose et al.

(10) Patent No.: US 9,875,785 B2
(45) Date of Patent: Jan. 23, 2018

(54) REFRESH TIMER SYNCHRONIZATION BETWEEN MEMORY CONTROLLER AND MEMORY

(71) Applicant: QUALCOMM Incorporated, San Diego, CA (US)

(72) Inventors: Edwin Jose, San Diego, CA (US); Michael Drop, La Mesa, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/246,371

(22) Filed: Aug. 24, 2016

(65) Prior Publication Data

US 2017/0098470 A1 Apr. 6, 2017

Related U.S. Application Data

(60) Provisional application No. 62/236,008, filed on Oct. 1, 2015.

(51) Int. Cl.
*G11C 11/4076* (2006.01)
*G11C 11/406* (2006.01)
*G11C 11/408* (2006.01)

(52) U.S. Cl.
CPC .... *G11C 11/40615* (2013.01); *G11C 11/4076* (2013.01); *G11C 11/4087* (2013.01); *G11C 11/40626* (2013.01)

(58) Field of Classification Search
CPC ........ G11C 11/40615; G11C 11/40626; G11C 11/4076; G11C 11/4087
USPC ........................................................ 365/222
See application file for complete search history.

(56) References Cited

U.S. PATENT DOCUMENTS

| 5,808,952 | A   | * | 9/1998  | Fung ................ G11C 11/406 365/222 |
| 6,118,719 | A   | * | 9/2000  | Dell ................. G11C 11/406 365/222 |
| 6,212,599 | B1  | * | 4/2001  | Baweja ............. G06F 1/3225 365/226 |
| 8,392,650 | B2  | * | 3/2013  | Bains ................ G11C 7/22 711/106 |
| 8,909,856 | B2  | * | 12/2014 | Bains ................ G11C 7/22 711/106 |
| 9,001,608 | B1  | * | 4/2015  | Chishti ........... G11C 11/40611 365/149 |
| 9,053,812 | B2  | * | 6/2015  | Bains ............. G11C 11/40615 |
| 9,292,426 | B2  | * | 3/2016  | Bains ................. G06F 12/02 |
| 9,460,773 | B2  | * | 10/2016 | Bains ............. G11C 11/40615 |
| 9,583,173 | B2  | * | 2/2017  | Rim ................. G11C 11/4074 |
| 9,620,195 | B1  | * | 4/2017  | Hyun ............... G11C 11/4074 |
| 9,672,893 | B2  | * | 6/2017  | Jung ............... G11C 11/40626 |
| 9,704,558 | B2  | * | 7/2017  | Doo ................ G11C 11/40626 |
| 9,721,640 | B2  | * | 8/2017  | Bains ............. G11C 11/40615 |

(Continued)

OTHER PUBLICATIONS

International Search Report and Written Opinion—PCT/US2016/048771—ISA/EPO—Nov. 28, 2016.

*Primary Examiner* — Anthan Tran
*Assistant Examiner* — Mushfique Siddique
(74) *Attorney, Agent, or Firm* — Haynes and Boone, LLP

(57) ABSTRACT

A memory controller is configured to communicate to a DRAM an indication of when a most-recent memory-controller-triggered refresh cycle occurred prior to a transition to a self-refresh mode of operation in which the DRAM self-triggers its refresh cycles.

17 Claims, 5 Drawing Sheets

Refresh timer value handoff from MC to DRAM during Self Refresh entry

(56) References Cited

U.S. PATENT DOCUMENTS

| | | | |
|---|---|---|---|
| 2003/0198115 A1* | 10/2003 | Schaefer | G11C 11/406 365/222 |
| 2004/0165466 A1* | 8/2004 | Schaefer | G11C 11/406 365/222 |
| 2005/0259493 A1* | 11/2005 | Walker | G11C 11/406 365/222 |
| 2005/0265103 A1 | 12/2005 | Remaklus et al. | |
| 2006/0114734 A1* | 6/2006 | Cruz | G11C 11/406 365/222 |
| 2009/0070612 A1 | 3/2009 | Adelman et al. | |
| 2011/0246713 A1* | 10/2011 | Bains | G11C 7/22 711/106 |
| 2014/0068172 A1* | 3/2014 | Zheng | G11C 11/406 711/106 |
| 2014/0169114 A1* | 6/2014 | Oh | G11C 11/40611 365/222 |
| 2015/0085594 A1* | 3/2015 | Dong | G11C 11/40626 365/222 |
| 2016/0196866 A1* | 7/2016 | Bains | G06F 12/02 365/149 |
| 2017/0062038 A1* | 3/2017 | Doo | G06F 13/1636 |

\* cited by examiner

REFRESH TIMER SYNCHRONIZATION BETWEEN MEMORY CONTROLLER AND MEMORY

CROSS-REFERENCE TO RELATED APPLICATIONS

This application claims the benefit of U.S. Provisional Application No. 62/236,008, filed Oct. 1, 2015, which is incorporated herein by reference.

TECHNICAL FIELD

This application relates to memories, and more particularly to a refresh timer synchronization between a memory controller and a corresponding memory.

BACKGROUND

Dynamic random access memory (DRAM) is relatively inexpensive because each memory cell requires just an access transistor and a capacitor. In contrast, static random access memory (SRAM) requires at least six transistors per memory cell and is thus more expensive. DRAM is therefore the memory of choice for bulk storage in many electronic devices such as smartphones. Although DRAM is considerably less expensive, the relatively small capacitor used for each memory cell leaks charge over time such that it is necessary to refresh its contents periodically. In a refresh cycle for a DRAM, the contents of a memory cell are read out so that the memory cell's capacitor may be recharged appropriately. It is critical for a DRAM to refresh regularly according to its refresh schedule or it may lose its memory contents.

The enforcement of refresh operations according to the required refresh interval may be performed by a memory controller, which acts as the interface between a host processor and the corresponding DRAM. In conventional desktop and related applications, the memory controller is typically contained in a separate integrated circuit that is associated with the memory slots that accept the DRAM integrated circuits. Such a standalone memory controller may remain powered during normal operation independently of the host processor. But in modern mobile device applications such as smartphones, the memory controller is integrated with the host processor into a system-on-a-chip (SoC). Reducing power consumption by an SoC is a major goal in smartphone design as consumers do not want to constantly recharge their devices. It is thus conventional for a mobile device SoC to implement a sleep mode in which the memory controller is powered down either completely or partially. But the associated DRAM integrated circuit for the SoC must remain powered on during the sleep mode so that it may retain its memory contents. The refresh scheduling for a DRAM in mobile and related devices is thus controlled by the memory controller during an active mode of operation and by the DRAM itself during an idle or sleep mode of operation. To distinguish between the two types of refresh scheduling management, the memory-controller-managed refresh scheduling may be denoted as a "refresh mode" of operation whereas the DRAM-controlled refresh scheduling may be denoted as a "self-refresh mode" of operation.

Although this split control of the refresh scheduling in mobile devices allows the SoC to save power by entering the sleep mode, it is associated with unnecessary triggering of refresh cycles. For example, during the refresh mode of operation, the DRAM does not keep track of the refresh schedule timing since that is being managed by the memory controller. Upon resumption of the self-refresh mode of operation, the DRAM thus triggers a refresh operation. But the memory controller may have just triggered a refresh operation prior to the handoff to the self-refresh mode of operation such that the automatic triggering of a refresh operation by the DRAM upon the transition to the self-refresh mode was unnecessary. Similarly, the memory controller triggers a refresh operation at the resumption of a refresh mode of operation and termination of a self-refresh mode. Depending upon the timing of the last refresh cycle in the DRAM, the automatic triggering of a refresh operation by the memory controller upon the transition to the refresh mode may also be unnecessary. These unnecessary refresh cycles needlessly consume power. In addition, they increase memory latency since the DRAM is unavailable for read and write access until a refresh cycle is completed. This problem of increased latency and power consumption is aggravated in modern SoCs, which are engineered to enter sleep mode more frequently to minimize power consumption.

Accordingly, there is a need in the art for improved refresh scheduling in systems in which both the memory controller and the memory itself may control refresh scheduling.

SUMMARY

To provide improved refresh scheduling, a memory controller is provided that is configured to inform its corresponding DRAM of when a most-recent-memory-controller-triggered refresh cycle was triggered by the memory controller prior to entering a sleep mode of operation. Given this information, the DRAM may then schedule a self-refresh cycle accordingly while the memory controller is in the sleep mode of operation. The DRAM is thus prevented from triggering a self-refresh cycle until a refresh interval has expired from the triggering of the most-recent-memory-controller-triggered refresh cycle.

Similarly, the DRAM is configured to inform the memory controller of when a most-recent self-refresh cycle was triggered by the DRAM upon the transition of the memory controller from the sleep mode of operation to an active mode of operation. The memory controller may then schedule a subsequent memory-controller-triggered refresh cycle during the active mode of operation accordingly. The memory controller is thus prevented from triggering a refresh cycle until the expiration of the self-refresh interval from the triggering of the most-recent self-refresh cycle.

In addition to providing the DRAM information regarding when a last refresh cycle was triggered, the memory controller may also provide the DRAM with information regarding a temperature of the DRAM. The DRAM may then reduce the remaining portion of the refresh cycle as transmitted from the memory controller to the DRAM responsive to the temperature measurement.

BRIEF DESCRIPTION OF THE DRAWINGS

Embodiments of the disclosure and their advantages are best understood by referring to the detailed description that follows. It should be appreciated that like reference numerals are used to identify like elements illustrated in one or more of the figures.

DETAILED DESCRIPTION

Figure 1:
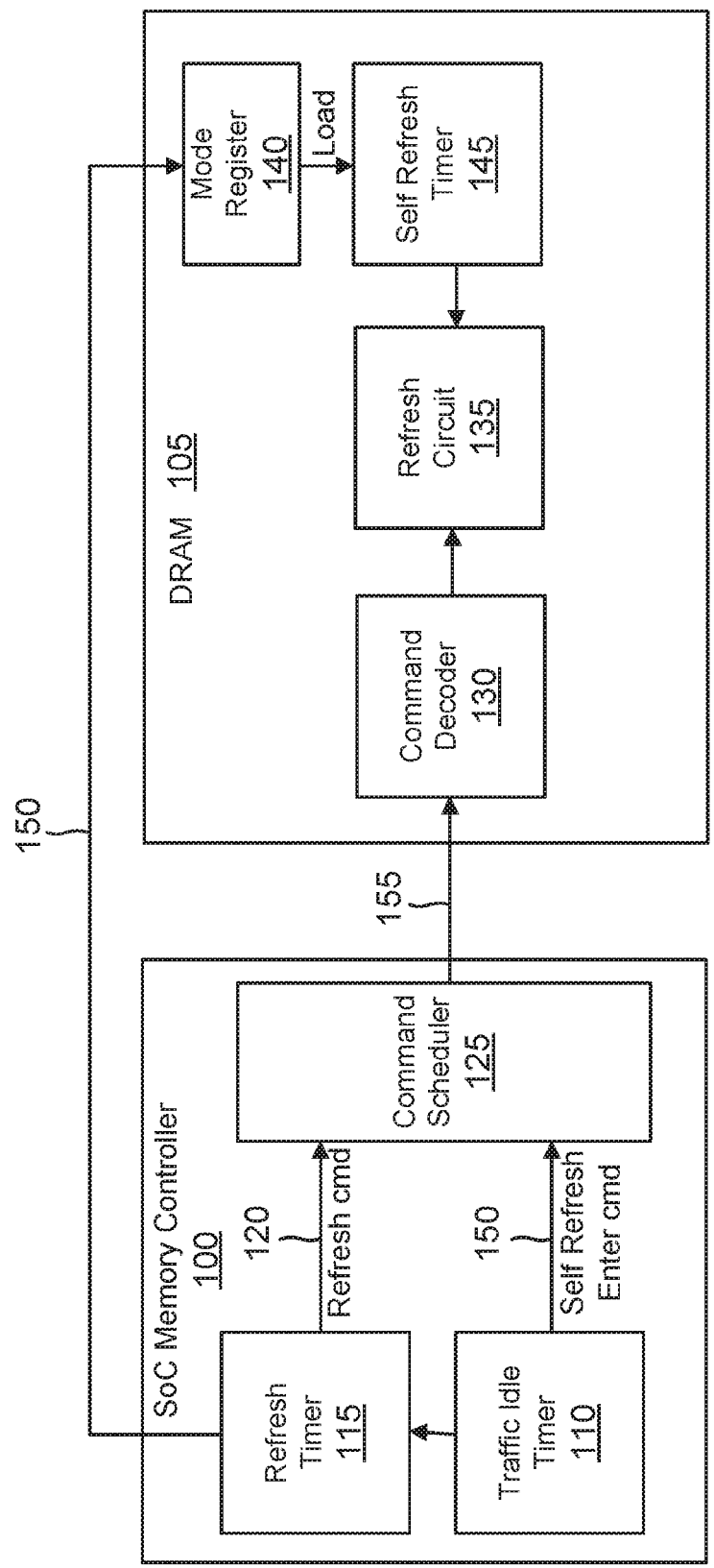
FIG. 1 illustrates a memory controller and a DRAM during entry of a self-refresh mode of operation in accordance with an aspect of the disclosure.

Turning now to the drawings, an SoC memory controller (MC) 100 and a DRAM integrated circuit 105 are shown in FIG. 1 during an entry into a self-refresh mode of operation in which MC 100 enters a sleep mode of operation while DRAM 105 manages its refresh cycles. In an embodiment, MC 100 includes a traffic idle timer 110 that times an idle period from when the last access (read or write operation) was performed on DRAM 105. Should the idle period not exceed an idle threshold, MC 100 continues to operate in a refresh mode of operation in which MC 100 controls the scheduling of refresh cycles in DRAM 105. To do so, MC 100 includes a refresh timer 115 that times a delay from the last memory-controller-triggered refresh cycle for DRAM 105. Should the delay equal a refresh interval for DRAM 105, refresh timer 115 asserts a refresh command (cmd) 120 to a command scheduler 125. In response, command scheduler 125 commands over a bus 155 for a command decoder 130 in DRAM 105 to trigger a refresh circuit 135 to perform a refresh cycle. In this fashion, refresh timer 115 periodically triggers a refresh cycle in DRAM 105 at a rate determined by the refresh interval during the refresh mode of operation.

Should traffic idle timer 110 timeout indicating that the idle threshold has been exceeded due to a lack of activity, traffic idle timer 110 may assert a self-refresh command (cmd) 150 to command scheduler 125. In turn, command scheduler 125 commands command decoder 130 to command DRAM 105 to enter the self-refresh mode of operation. At the same time traffic idle timer 110 asserts self-refresh command 150, it also triggers refresh timer 115 to write over a bus 150 to a mode register 140 in DRAM 105 so as to inform DRAM 105 of when the last memory-controller-triggered refresh cycle occurred. This communication may be performed by refresh timer 115 writing into mode register 140 the time expired since the last (most-recent) memory-controller-triggered refresh cycle or the time remaining in the current refresh interval. Alternatively, refresh timer 115 may digitize the remaining portion (if any) of the current refresh interval since the most-recent-memory-controller-triggered refresh cycle. For example, refresh timer 115 may use a three-bit digitization such that it may estimate in increments of ⅛ the remaining portion of the current refresh interval. Alternatively, refresh timer 115 may use a four-bit digitization (increments of ¹⁄₁₆ or lower or higher orders of digitization. The following discussion will assume without loss of generality that refresh timer 115 writes a digitized remaining portion of the current refresh interval into mode register 140 as this requires relatively few bits and is thus bandwidth efficient.

DRAM 105 may then enter the self-refresh mode of operation by loading over bus 150 the digitized estimated remaining portion of the current refresh interval from mode register 140 into a self-refresh timer 145. For example, if refresh timer 115 had indicated that there was $⅛^{th}$ remaining of the current refresh interval, self-refresh timer 145 may then count down to just $⅛^{th}$ of the refresh interval before triggering the initial DRAM-triggered self-refresh cycle in DRAM refresh circuit 135. After triggering this initial self-refresh cycle, self-refresh timer 145 would then count down from the full refresh interval for the triggering of subsequent self-refresh cycles. DRAM 105 would then manage its self-refresh cycles until SoC memory controller 100 resumes normal operation and exits the sleep mode.

The refresh timer 115 may also inform DRAM 105 of the current temperature mulitplier for the refresh interval. The leakage from the capacitors in the DRAM memory cells increases with temperature. Therfore it may be advantageous to decrease the refresh interval with increasing temperature, whether in a memory controller-triggered refresh cycle or in a self-refresh cycle controlled by the DRAM. Like the remaining portion of the current refresh interval, this decrease in the refresh interval may also be digitized using a certain number of bits and represented by a digitized temperature multiplier. For example, suppose that the temperature multiplier is digitized into a 3-bit number. At room temperature the digitized temperature mulitplier may equal one in that no reduction in the refresh interval is indicated. As the temperature increases, the digitized temperature multiplier may progressively decrease from one. Refresh timer 115 may thus also write the digitized temperature multiplier into mode register 140 or another register (not illlustrated) in DRAM 105 analogous to the write by memory controller 100 of the remaining portion of the refresh cycle to mode register 140.

Figure 2:
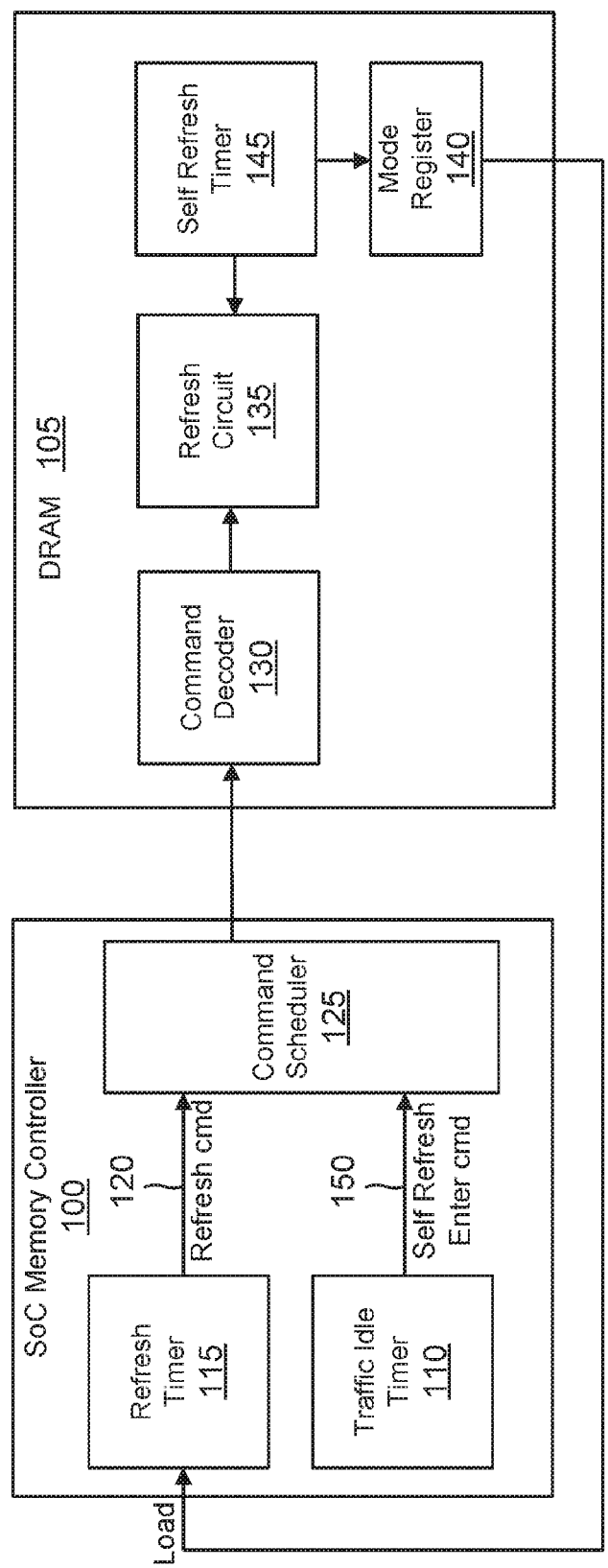
FIG. 2 illustrates the memory controller and DRAM during exit of the self-refresh mode of operation in accordance with an aspect of the disclosure.

In a transition from the self-refresh mode to the refresh mode of operation in response to SoC memory controller 100 exiting the sleep mode to resume normal (active) operation, self-refresh timer 145 may write a digitized remaining portion (if any) of the current refresh interval into mode register 140 (or another suitable register) as shown in FIG. 2. Refresh timer 115 may then read the contents of mode register 140 over bus 150 so that it counts down from the remaining portion of the refresh interval for the initial refresh cycle upon transition into the refresh mode. After refresh timer 115 triggers the initial refresh cycle according to whatever portion remains as notified through the read from mode register 140, refresh timer 115 would then count down using the entire refresh interval for any subsequent memory-controller-triggered refresh cycles until another transition to the self-refresh mode of operation. Note that self-refresh timer 145 may also write a current digitized temperature multiplier into mode register 140 or another analogous register. Refresh timer 115 would then use this multiplier in conjunction with the remaining refresh interval portion from mode register 140. For example, suppose that mode register 140 indicates that the last DRAM-triggered refresh cycle took place ½ of the refresh interval ago. If DRAM 105 indicates that the temperature multiplier is ½ due to an elevated DRAM temperature, refresh timer 115 would then count down not from ½ of the default (room temperature) refresh interval but from ¼ of the default refresh interval due to the reduction from the elevated temperature.

Figure 3A:
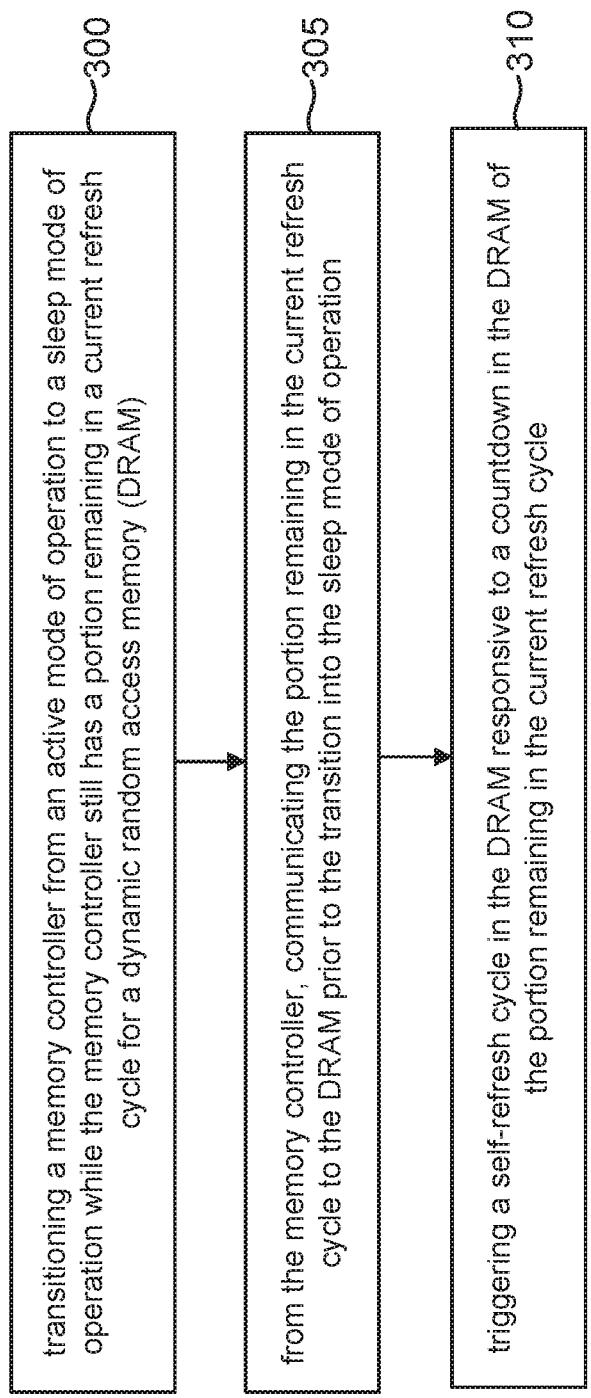
FIG. 3A is a flowchart for a method of operation for a transition from a memory-controller-controlled refresh mode for a DRAM to a self-refresh mode for the DRAM in accordance with an aspect of the disclosure.

FIG. 3A is a flowchart for a refresh-mode to a self-refresh mode of operation such as discussed with regard to FIG. 1. The method includes an act 300 of transitioning a memory controller from an active mode of operation to a sleep mode of operation while the memory controller still has a portion remaining in a current refresh cycle for a DRAM. The transition of memory controller 100 of FIG. 2 from the active mode to a sleep mode of operation is an example of act 300. The method further includes an act 305 of, from the memory controller, communicating the portion remaining in the current refresh cycle to the DRAM prior to the transition into the sleep mode of operation. The writing into mode register 140 by refresh timer 115 identifying the portion remaining of the current refresh cycle is an example of act 305. Finally, the method includes an act 310 of triggering a self-refresh cycle in the DRAM responsive to a countdown in the DRAM of the portion remaining in the current refresh cycle. The countdown in self-refresh timer 145 and subsequent triggering of a self-refresh cycle by refresh circuit 135 is an example of act 310.

Figure 3B:
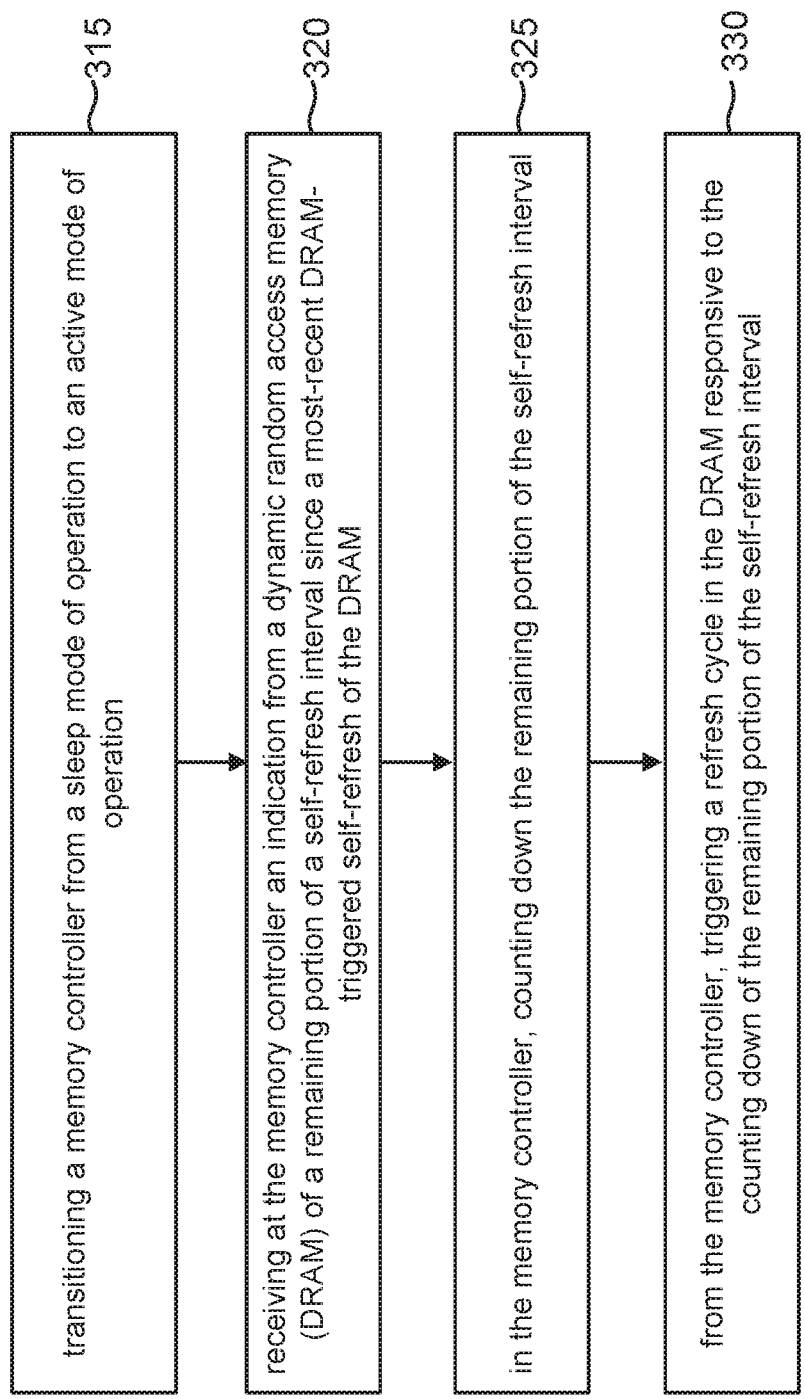
FIG. 3B is a flowchart for a method of operation for a transition from a self-refresh mode for a DRAM to a memory-controller-controled refresh mode for the DRAM in accorance with an aspect of the disclosure.

FIG. 3B is a flowchart showing a method for entering a self-refresh mode of operation from a refresh mode of operation. The method includes an act 315 transitioning a memory controller from a sleep mode of operation to an active mode of operation. The transition of memory controller 100 in FIG. 2 from the sleep mode of operation to the active mode of operation is an example of act 315. The method also includes an act 320 of receiving at the memory controller an indication from a dynamic random access memory (DRAM) of a remaining portion of a self-refresh interval since a most-recent DRAM-triggered self-refresh of the DRAM. The reading of mode register 140 by refresh timer 115 is an example of act 320. In addition, the method includes an act 325 of, in the memory controller, counting down the remaining portion of the self-refresh interval. The counting down of the remaining portion by refresh timer 115 of the self-refresh interval as retrieved from mode register 140 is an example of act 325. Finally, the method includes an act 330 of, from the memory controller, triggering a refresh cycle in the DRAM responsive to the counting down of the remaining portion of the self-refresh interval. The triggering by command scheduler 125 of a refresh cycle in DRAM 105 is an example of act 330.

Figure 4:
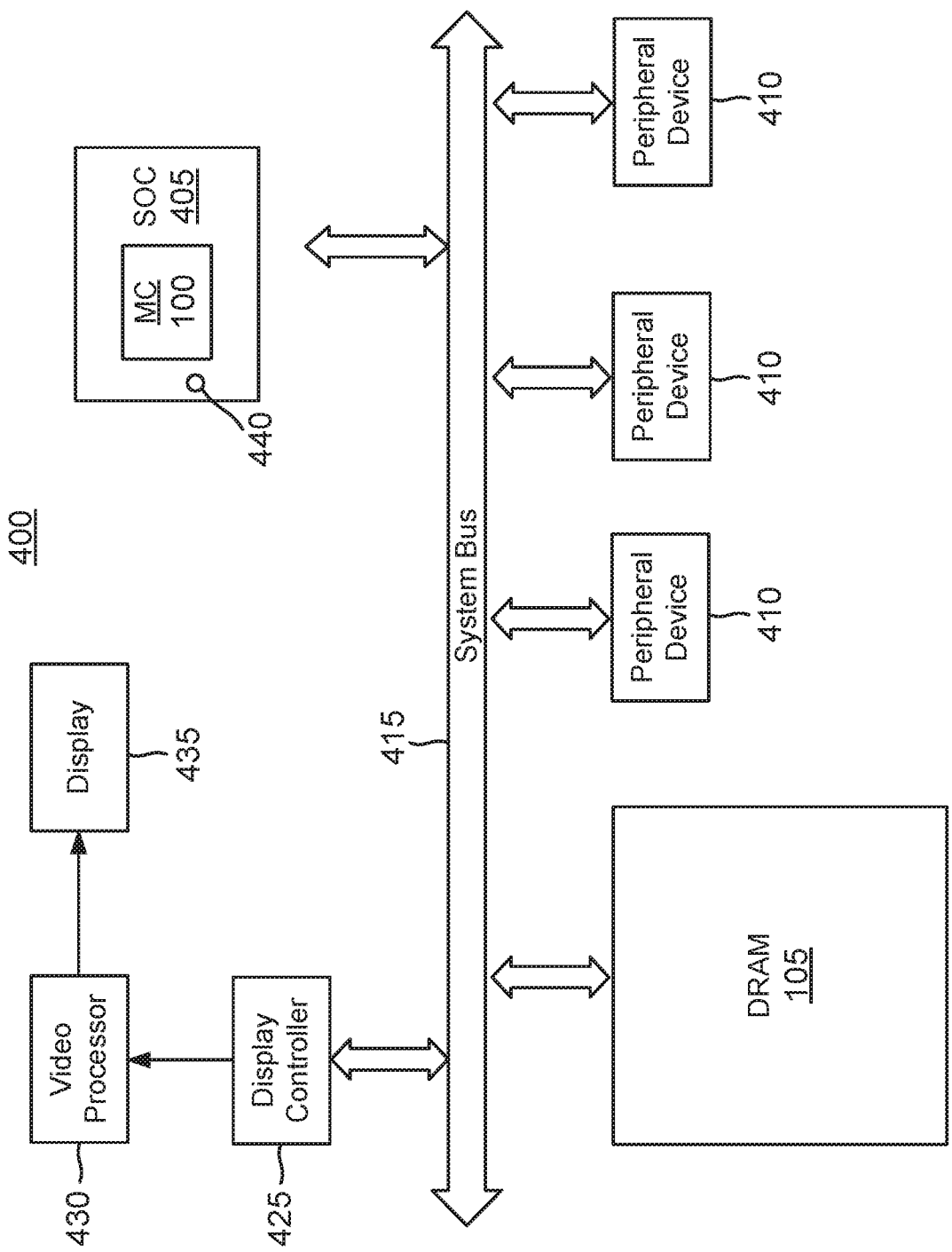
FIG. 4 illustrates a device including the memory controller and DRAM of FIG. 1 and FIG. 2 according to an aspect of the invention.

The memory controller 100 may be incorporated within a system-on-a-chip (SoC) 405 within a device 400 as shown in FIG. 4. Device 400 may comprise a cellular phone, smart phone, personal digital assistant, tablet computer, laptop computer, digital camera, handheld gaming device, or other suitable device. Memory controller 100 within SoC 405 communicates with DRAM 105 over a system bus 415. SoC 405 also communicates with peripheral devices 410 such as sensors over system bus 415. A display controller 425 also couples to system bus 415. In turn display controller 425 couples to a video processor 430 that drives a display 435. SoC 405 may also include a temperature sensor 440 in or near the DRAM 105 to monitor the temperature of DRAM 105.

The steps of a method or algorithm described in connection with the disclosure may be embodied directly in hardware, in a software module executed by a processor, or in a combination of the two. If implemented in software, the functions may be stored on one or more instructions or code on a computer-readable medium. An exemplary computer-readable medium is coupled to the processor such that the processor can read information from, and write information to, the computer-readable medium. In the alternative, the computer-readable medium may be intergral to the processor.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A method of transitioning a memory controller from a sleep mode of operation to an active mode of operation, comprising;
   receiving at the memory controller an indication of a remaining portion of a self-refresh interval since a most-recent DRAM-triggered self-refresh of a DRAM, wherein the remaining portion is less than the self-refresh interval;
   in the memory controller, timing the remaining portion of the self-refresh interval;
   from the memory controller, triggering an initial refresh cycle in the DRAM responsive to the timing of the remaining portion of the self-refresh interval; and
   timing an idle period for the memory controller; and
   responsive to the timing of the idle period exceeding a threshold, transitioning the memory controller from the active mode of operation back to the sleep mode of operation.

2. The method of claim 1, further comprising:
   wherein receiving at the memory controller the remaining portion of the self-refresh interval comprises reading the indication from a register in the DRAM.

3. The method of claim 1, further comprising:
   after the triggering of the initial refresh cycle, triggering additional memory-controller-triggered refresh cycles of the DRAM periodically according to a refresh interval.

4. The method of claim 3, wherein the refresh interval equals the self-refresh interval.

5. The method of claim 1, further comprising:
   decreasing the remaining portion of the self-refresh interval responsive to an indication of a temperature of the DRAM.

6. A memory controller, comprising;
   a refresh timer configured to time a portion of a self-refresh interval responsive to an indication from a dynamic random access memory (DRAM) of when a most-recent self-refresh cycle occurred as triggered by the DRAM, wherein the portion of the self-refresh interval is less than the self-refresh interval; and
   a command scheduler configured to trigger an initial memory-controller-triggered refresh cycle in the DRAM responsive to the timing of the portion of the self-refresh interval by the refresh timer, wherein the refresh timer is further configured to write a remaining portion of a current refresh interval into a mode register in the DRAM responsive to a determination that the memory controller should enter a sleep mode.

7. The memory controller of claim 6, wherein the refresh timer is configured to read the indication from a register in the DRAM.

8. The memory controller of claim 6, wherein the refresh timer is further configured to trigger additional memory-controller-triggered refresh cycles periodically according to a refresh interval after the triggering of the initial memory-controller-triggered refresh cycle.

9. The memory controller of claim 6, wherein the refresh timer is further configured to decrease the portion of the self-refresh interval responsive to an indication of a temperature of the DRAM.

10. A dynamic random access memory (DRAM), comprising:
  a self-refresh timer configured to time a remaining portion of a self-refresh interval responsive to an indication from a memory controller transitioning into a sleep mode of operation of when a most-recent refresh cycle occurred as triggered by the memory controller, wherein the remaining portion of the self-refresh interval is less than the self-refresh interval; and
  a refresh circuit configured to refresh the DRAM responsive to the self-refresh timer timing the remaining portion of the self-refresh interval.

11. The DRAM of claim 10, wherein the refresh circuit is further configured to refresh the DRAM in self-refresh cycles responsive to the self-refresh timer timing additional self-refresh intervals.

12. The DRAM of claim 11, further comprising:
  a mode register, wherein the self-refresh timer is configured to write a first indication to the mode register of when a most-recent self-refresh cycle occurred responsive to a second indication from the memory controller that the memory controller has transitioned from the sleep mode of operation to an active mode of operation.

13. The DRAM of claim 10, further comprising:
  a command decoder configured to decode a refresh command from the memory controller.

14. A method, comprising:
  transitioning a memory controller from an active mode of operation to a sleep mode of operation while the memory controller still has a portion remaining in a current refresh cycle for a DRAM, wherein the portion remaining in the current refresh cycle is less than a refresh interval for the DRAM;
  from the memory controller, communicating the portion remaining in the current refresh cycle to the DRAM prior to the transition into the sleep mode of operation; and
  triggering a self-refresh cycle in the DRAM responsive to a timing in the DRAM of the portion remaining in the current refresh cycle.

15. The method of claim 14, further comprising triggering additional self-refresh cycles in the DRAM while the memory controller remains in the sleep mode of operation.

16. The method of claim 14, wherein communicating the portion remaining in the current refresh cycle comprises the memory controller writing into a register within the DRAM.

17. The method of claim 14, further comprising:
  transitioning the memory controller from the sleep mode of operation back into the active mode of operation; and
  in the memory controller, reading from the DRAM an indication of when a last self-refresh cycle was triggered prior to the memory controller transitioning back into the active mode of operation.

* * * * *